(12) United States Patent
Hayata

(10) Patent No.: US 7,848,022 B2
(45) Date of Patent: Dec. 7, 2010

(54) IMAGING DEVICE AND METHOD FOR A BONDING APPARATUS

(75) Inventor: Shigeru Hayata, Tachikawa (JP)

(73) Assignee: Kabushiki Kaisha Shinkawa, Tokyo (JP)

( * ) Notice: Subject to any disclaimer, the term of this patent is extended or adjusted under 35 U.S.C. 154(b) by 365 days.

(21) Appl. No.: 12/157,025

(22) Filed: Jun. 6, 2008

(65) Prior Publication Data
US 2009/0124028 A1    May 14, 2009

(30) Foreign Application Priority Data
Jun. 8, 2007    (JP) .............................. 2007-152641

(51) Int. Cl.
*G02B 27/10* (2006.01)
(52) U.S. Cl. ..................................... 359/618
(58) Field of Classification Search ................ 359/618, 359/626, 629, 798–802
See application file for complete search history.

(56) References Cited
FOREIGN PATENT DOCUMENTS

| JP | 02-301148 | 12/1990 |
|---|---|---|
| JP | 05-332739 | 12/1993 |
| JP | 3272640 | 4/2002 |

*Primary Examiner*—Alicia M Harrington
(74) *Attorney, Agent, or Firm*—William L. Androlia; H. Henry Koda

(57) ABSTRACT

An imaging device and method of a bonding apparatus in which the imaging device includes: a high-magnification optical system having first and second high-magnification optical paths that extend to multiple imaging planes through a high-magnification lens and have different optical path lengths from the high-magnification lens to the respective imaging planes correspondingly to multiple subject imaging ranges which are at different distances from the high-magnification lens; and a low-magnification optical system having a low-magnification optical path that extends to an imaging plane through a low-magnification lens and having a field of view wider than those of the high-magnification optical paths. The imaging elements on the respective imaging planes in the high-magnification optical system are adapted to image semiconductor chips, while the imaging element on the imaging plane in the low-magnification optical system is adapted to image a lead frame.

12 Claims, 9 Drawing Sheets

IMAGING DEVICE AND METHOD FOR A BONDING APPARATUS

CROSS-REFERENCE TO RELATED APPLICATIONS

This application calms priority under 35 USC 119 from Japanese Patent Application No. 2007-152641, the disclosure of which is incorporated by reference herein.

BACKGROUND OF THE INVENTION

The present invention relates to a structure of an imaging device for a bonding apparatus and to an imaging method using the imaging device for a bonding apparatus.

The assembling of semiconductor devices includes: a die bonding step of bonding semiconductor chips cut out from a wafer on a lead frame or substrate; and a wire bonding step of wire-connecting pads on the semiconductor chips bonded on the lead frame or substrate to the lead frame or leads on the substrate. The wire bonding provides wire connections between the pads and leads by pressing a bonding tool such as a capillary with a wire inserted therethrough at a first bonding point on a lead or pad, thus bonding the wire with an ultrasonic vibration, and then looping the wire from the first bonding point toward a corresponding pad or lead, and pressing and bonding the wire at a second bonding point on the corresponding pad or lead with an ultrasonic vibration. Since wire bonding is required to provide precise connections between pads and leads that have small areas, it is necessary to press the leading end of a bonding tool such as a capillary precisely on the pads and leads.

However, the bonding accuracy between a lead frame or substrate and semiconductor chips is often varied, which can result in a deterioration in bonding quality unless the positional relationship is corrected.

To address this issue, it has been practiced that before wire bonding, pads and leads are imaged using a camera, the image is then processed to read a particular pattern as a binary image, and the positions of the pads and leads are detected and corrected accordingly.

However, if the difference in level between the surfaces of semiconductor chips and leads is increased with an increase in the size of the semiconductor device and the number of pins, the pads on the surfaces of the semiconductor chips and the lead frame or the leads on the surface of the substrate can not be included concurrently within the depth-of-field of the camera, resulting in defocusing either of the images to make position detection impossible.

For this reason, there has been a proposed method of providing two cameras that are focused, respectively, on chips and leads in the same field of view, imaging the chips and leads using the respective cameras, and performing position detection based on the images (see Patent Document 1, for example).

There has also been a proposed method of providing a shutter for switching optical paths in an optical system having two optical paths with different optical path lengths that include chips and leads within their respective depth-of-fields, and switching the optical paths by the shutter to image the chips and leads using a common camera through each optical path (see Patent Document 2, for example).

There has further been a proposed method of imaging semiconductor chips and leads at mutually different heights using three cameras (refer to Patent Document 3, for example).

[Patent Document 1] Japanese Patent Application Unexamined Publication Disclosure No. 2-301148

[Patent Document 2] Japanese Patent No. 3272640

[Patent Document 3] Japanese Patent Application Unexamined Publication Disclosure No. 5-332739

However, multilayer semiconductor devices in which semiconductor chips are stacked in multiple layers on a lead frame have started to be produced in the recent demand for capacity increase and space saving in semiconductor devices. Such stacking semiconductor chips in multiple layers increase the difference in level in the height direction of the semiconductor chips, requiring imaging devices available for the more increased difference in level in the height direction. In addition, the demand for space saving makes the pitch as well as the size of the pads on the semiconductor chips smaller. This requires an improved imaging accuracy to detect the positions of the pads accurately before wire bonding, requiring high-magnification imaging devices.

In contrast, the dimensional accuracy of lead frames is lower than that of semiconductor chips, and leads are often arranged in substantially varied positions. It is, therefore, necessary to image all the leads connected to the pads on the semiconductor chips to detect the positions of all the leads before wire bonding between each semiconductor chip and lead frame.

Trying to address such demands with the related arts disclosed in Patent Documents 1 to 3 requires multiple higher-magnification and small-field optical systems to be combined, where such higher-magnification optical systems would narrow the field of view imageable in each optical system. However, since the leads are provided around the semiconductor chips, the imaging area for detecting the positions of the leads becomes larger. Imaging such a large area using a small-field optical system for each semiconductor chip or each layer would take a long time to detect the positions of the leads, resulting in a problem that high-speed wire bonding cannot be achieved. On the contrary, combining multiple lower-magnification optical systems using the related arts disclosed in Patent Documents 1 to 3 would not take a long time to detect the positions of the leads, but the imaging accuracy for pads cannot be so high, resulting in a problem that the positions of pads arranged at a small pitch can not be detected accurately.

In other words, the demands for accurate imaging of semiconductor chips having a great difference in level in the height direction and the demands for reduction in time for imaging a lead frame to achieve high-speed wire bonding conflict with each other. The related arts disclosed in Patent Documents 1 to 3 cannot meet such conflicting demands.

BRIEF SUMMARY OF THE INVENTION

It is an object of the present invention to accurately image semiconductor chips having a great difference in level in the height direction and to reduce the time for imaging a lead frame.

According to an exemplary embodiment of the present invention, an imaging device for a bonding apparatus for imaging an imaging subject and multi-layered semiconductor chips mounted on the imaging subjects configured to include:

a first optical system having a plurality of optical paths that extend to a plurality of imaging planes through a first lens and have different optical path lengths from the first lens to the respective imaging planes correspondingly to a plurality of subject imaging ranges at different distances from the first lens;

a second optical system branching from the first optical system on a subject side of the first lens and having an optical path that extends to an imaging plane through a second lens with lower magnification than the first lens, the second optical system having a field of view wider than that of the first optical system;

first imaging elements provided on the respective imaging planes in the first optical system to image each layer of the multi-layered semiconductor chips mounted on the imaging subject; and a second imaging element provided on the imaging plane in the second optical system to image the imaging subject.

In this imaging device of the present invention, the above-described imaging subject is one of a lead frame and a substrate.

According to another exemplary embodiment of the present invention, an imaging device for a bonding apparatus for imaging imaging subject and multi-layered semiconductor chips mounted on the imaging subject is configured to include:

a first optical system having a plurality of optical paths that extend to a plurality of imaging planes through a subject side lens and a first imaging plane lens and have different optical path lengths from the subject side lens to the respective imaging planes;

a second optical system branching from the first optical system between the subject side lens and the first imaging plane lens and having an optical path that extends to an imaging plane through a second imaging plane lens having a total magnification with the subject side lens which is lower than a total magnification of the subject side lens with the first imaging plane lens, the second optical system having a field of view wider than that of the first optical system;

first imaging elements provided on the respective imaging planes in the first optical system to image each layer of the multi-layered semiconductor chips mounted on the imaging subject; and a second imaging element provided on the imaging plane in the second optical system to image the imaging subject.

In this imaging device of the present invention as well, the above-described imaging subject is one of a lead frame and a substrate.

In the imaging devices for a bonding apparatus according to the present invention, the first imaging elements in the first optical system are preferably configured to cooperate with each other to image each layer of the multi-layered semiconductor chips mounted on the imaging subject. The first optical system preferably has an optical path length adjustment means installed in each optical path between the first imaging plane lens and each imaging plane, and this optical path length adjustment means is provided so as to be variable in position in the direction along each optical path. The optical path length adjustment means is preferably an optical path length adjustment lens, the optical path length adjustment lens is made any one of light transmitting glass, plastic, and ceramic.

According to another exemplary embodiment of the present invention, an imaging method of imaging an imaging subject and multi-layered semiconductor chips mounted on the imaging subject using an imaging device for a bonding apparatus is configured to include the steps of:

providing an imaging device for a bonding apparatus, the imaging device including:

a first optical system having a plurality of optical paths that extend to a plurality of imaging planes through a first lens and have different optical path lengths from the first lens to the respective imaging planes correspondingly to a plurality of subject imaging ranges at different distances from the first lens, a second optical system branching from the first optical system on a subject side of the first lens and having an optical path that extends to an imaging plane through a second lens with a lower magnification than the first lens, the second optical system having a field of view wider than that of the first optical system, first imaging elements provided on the respective imaging planes in the first optical system, and second imaging element provided on the imaging plane in the second optical system;

a lead image imaging step of scanning the field of view of the second optical system on the imaging subject to cause the second imaging element provided on the imaging plane in the second optical system to image the imaging subject including leads around an entire circumference of the multi-layered semiconductor chips; and a semiconductor chip imaging step of, using the first imaging elements provided on the respective imaging planes in the first optical system, imaging each layer of the multi-layered semiconductor chips at a plurality of height positions.

In this imaging method of the present invention, the above-described imaging subject is one of a lead frame and a substrate.

According to another exemplary embodiment of the present invention, an imaging method of imaging an imaging subject and multi-layered semiconductor chips mounted on the imaging subject using an imaging device for a bonding apparatus is configured to include the steps of:

providing an imaging device for a bonding apparatus, the imaging device including:

a first optical system having a plurality of optical paths that extend to a plurality of imaging planes through a subject side lens and a first imaging plane lens and have different optical path lengths from the first subject side lens to the respective imaging planes correspondingly to a plurality of subject imaging ranges at different distances from the subject side lens, a second optical system branching from the first optical system between the subject side lens and the first imaging plane lens and having an optical path that extends to an imaging plane through a second imaging plane lens having a total magnification with the subject side lens which is lower than a total magnification of the subject side lens with the first imaging plane lens, the second optical system having a field of view wider than that of the first optical system, first imaging elements provided on the respective imaging planes in the first optical system, and a second imaging element provided on the imaging plane in the second optical system;

a lead image imaging step of scanning the field of view of the second optical system on the imaging subject to cause the second imaging element provided on the imaging plane in the second optical system to image the imaging subject including leads around an entire circumference of the multi-layered semiconductor chips; and a semiconductor chip imaging step of, using the first imaging elements provided on the respective imaging planes in the first optical system, imaging each layer of the multi-layered semiconductor chips at a plurality of height positions.

In this imaging method of the present invention as well, the above-described imaging subject is one of a lead frame and a substrate.

The present invention exhibits an advantageous effect that semiconductor chips with a great difference in level in the height direction can be imaged accurately and the time for imaging the lead frame and the substrate can be reduced.

DETAILED DESCRIPTION OF THE INVENTION

Figure 1:
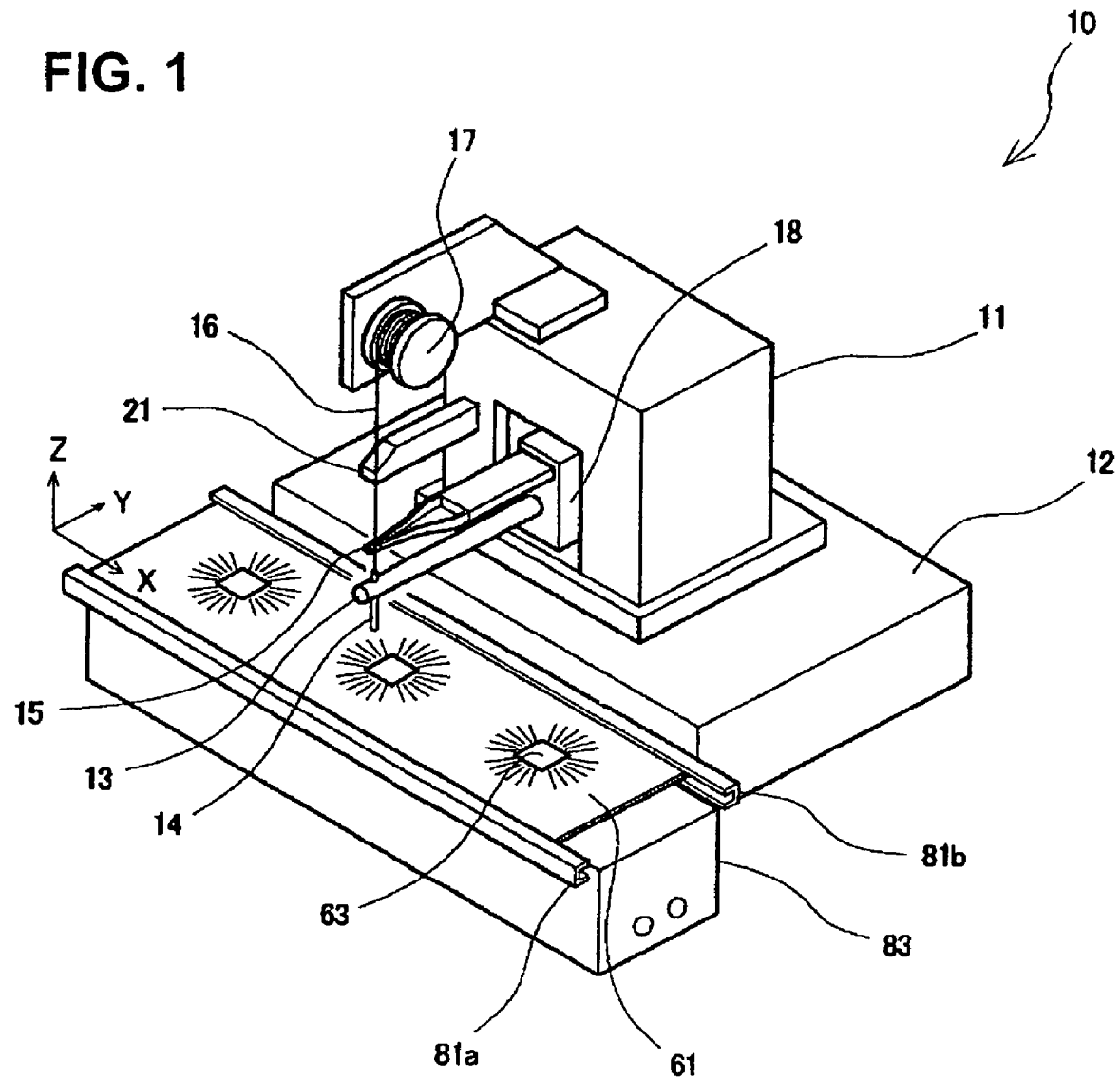
FIG. 1 is a perspective view of a wire bonder having an imaging device for bonding apparatus according to an exemplary embodiment of the present invention.

Exemplary embodiments when the present invention is applied to a wire bonder will hereinafter be described in detail with reference to the accompanying drawings. In the following descriptions, the feed direction, width direction, and height direction of a lead frame 61 are defined, respectively, as X, Y, and Z directions. As shown in FIG. 1, a wire bonder 10 includes a Z-direction drive mechanism 18 installed in a bonding head 11 that is mounted on an X-Y table 12 to be movable freely in the X and Y directions. The Z-direction drive mechanism 18 is equipped with an ultrasonic horn 13 and a clamper 15, and a capillary 14 is fixed to the leading end of the ultrasonic horn 13. A wire 16 is inserted through the capillary 14, the wire 16 being supplied from a spool 17. In addition, an imaging device 21 for bonding apparatus is fixed to the bonding head 11.

Guide rails 81a and 81b for guiding the lead frame 61 with semiconductor chips 63 mounted thereon in a die bonding step and a bonding stage 83 for providing a vacuum to cause the lead frame 61 to stick thereto are attached to a frame (not shown in the drawing) of the wire bonder 10.

The wire bonder 10 is adapted to detect the positions of the semiconductor chips 63 and the lead frame 61 based on images taken by the imaging device 21, drive the X-Y table 12 so that the capillary 14 is positioned over each pad on the semiconductor chips 63, operate the Z-direction drive mechanism 18 to drive the capillary 14 in the Z direction that is fixed to the leading end of the ultrasonic horn 13, and bond the wire 16, which is inserted through the capillary 14, between each pad on the semiconductor chips 63 and each lead on the lead frame 61.

After bonding between a pad on one semiconductor chip 63 and a lead on the lead frame 61, the wire bonder 10 drives the X-Y table 12 so that the capillary 14 is positioned over the next pad to bond the wire 16 between each pad and lead, as in the case described above. Then, if all the pads on one set of semiconductor chips 63 have completely been connected to leads on the lead frame 61 by wires 16, the lead frame 61 is carried so that the next set of semiconductor chips 63 are brought to the bonding position. The imaging device 21 images the semiconductor chips 63 and the lead frame 61 to position the capillary 14 for wire bonding based on the images obtained.

Figure 2:
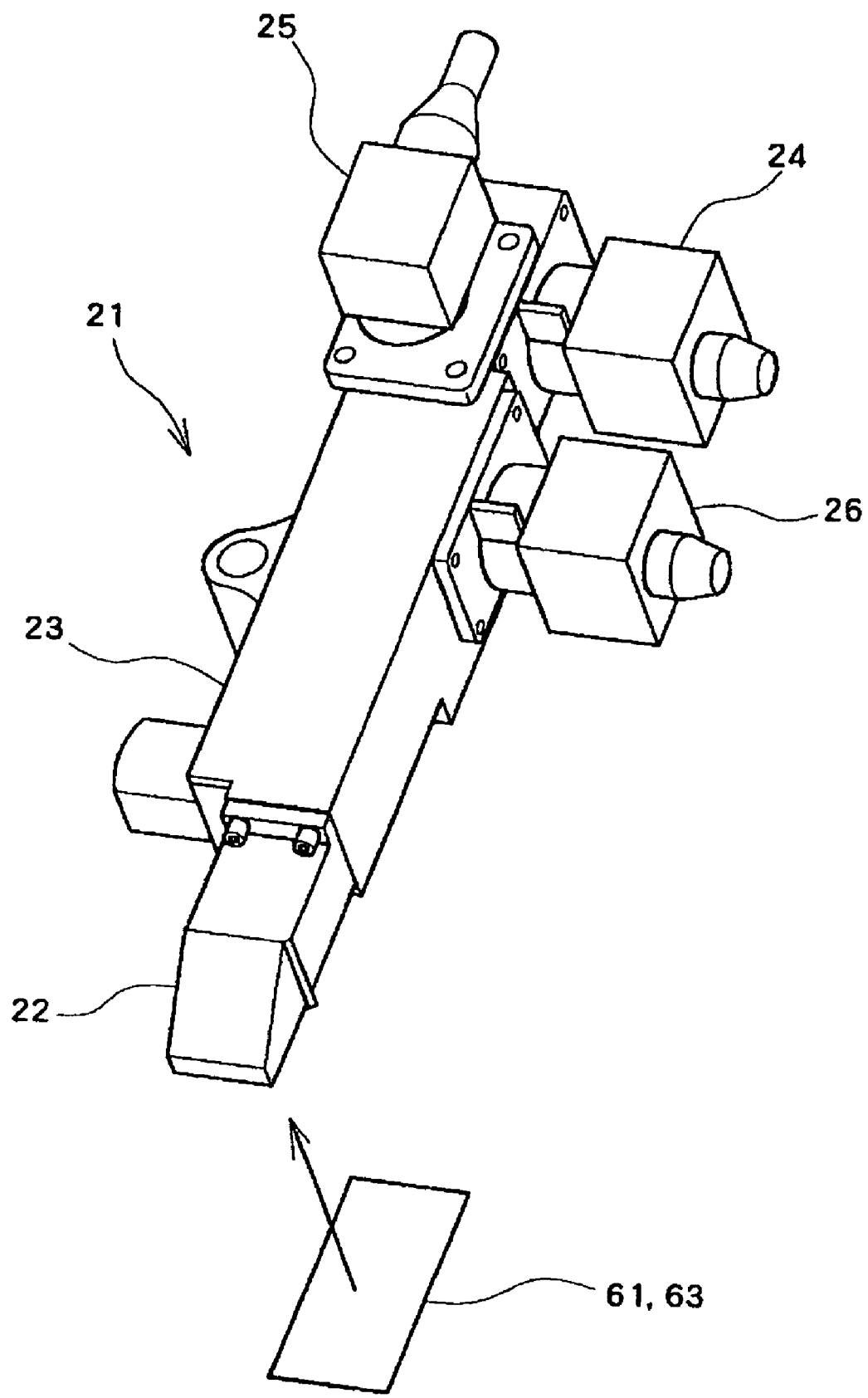
FIG. 2 is a perspective view of the imaging device according to an exemplary embodiment of the invention.

As shown in FIG. 2, the imaging device 21 includes: an introduction section 22 for introducing light from the subject semiconductor chips 63 or lead frame 61 therethrough; a tubular framework 23 incorporating optical components such as lenses and mirrors to guide light incident through the introduction section 22; and cameras 24, 25, and 26 that include imaging elements attached to the tubular framework 23 to receive light passing through the tubular framework 23.

Figure 3:
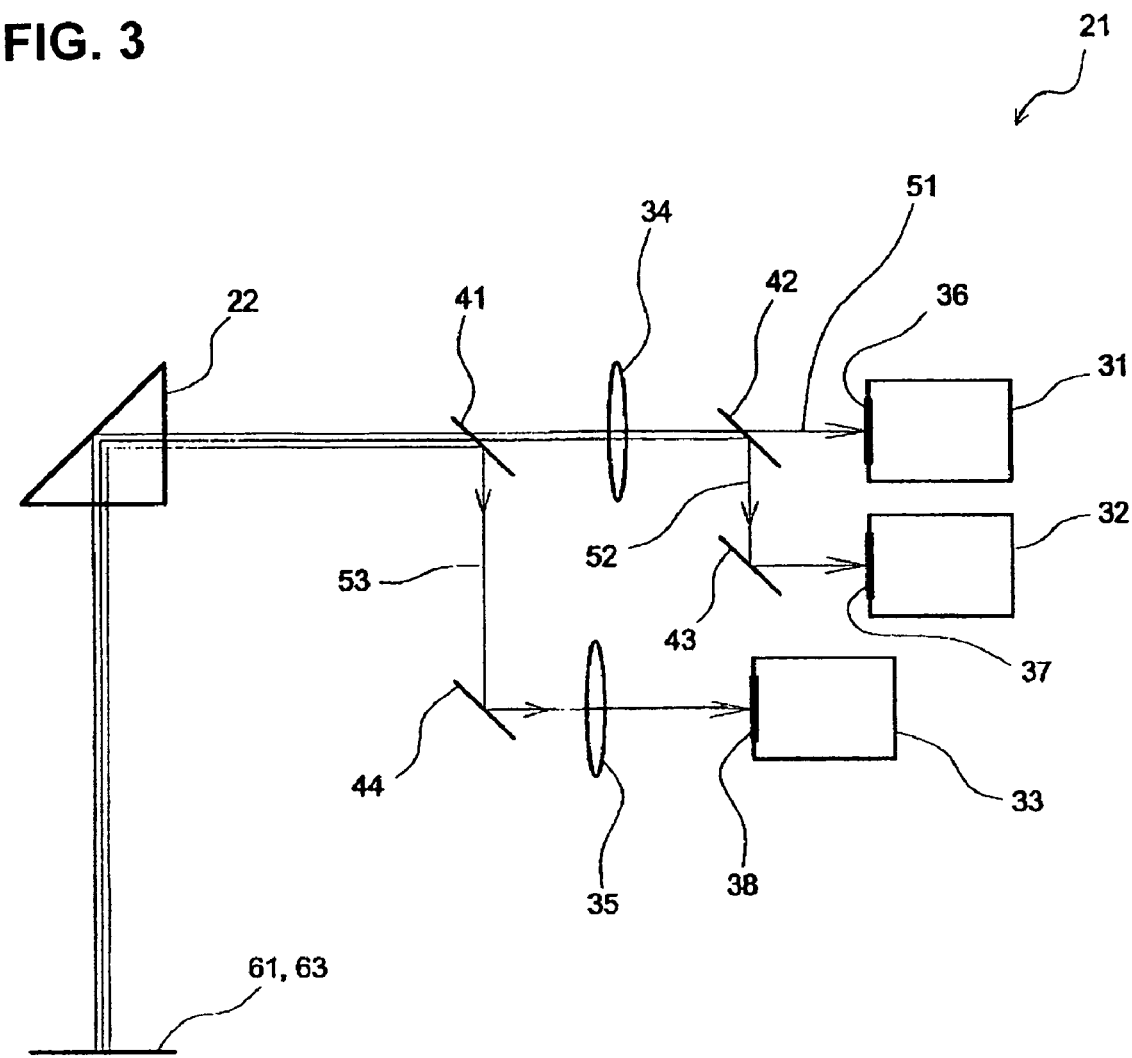
FIG. 3 is an illustrative view showing the configuration of optical systems in the imaging device for bonding apparatus according to an exemplary embodiment of the invention.

As shown in FIG. 3, the imaging device 21 has a high-magnification optical system as a first optical system and a low-magnification optical system as a second optical system.

The high-magnification optical system includes: a first high-magnification optical path 51 extending from the subject semiconductor chips 63 or lead frame 61 to an imaging plane 36 through the introduction section 22, a half mirror 41, a high-magnification lens 34, and a half mirror 42; and a second high-magnification optical path 52 extending from the subject semiconductor chips 63 or lead frame 61 to an imaging plane 37 through the introduction section 22, half mirror 41, high-magnification lens 34, reflected at the half mirror 42 to branch from the first high-magnification optical path 51, and reflected at a mirror 43. The low-magnification optical system includes: a low-magnification optical path 53 extending from the subject semiconductor chips 63 or lead frame 61 to an imaging plane 38 through the introduction section 22, reflected at the half mirror 41 on the subject side of the high-magnification lens 34 to branch from the high-magnification optical system, and reflected at a mirror 44 to pass through a low-magnification lens 35.

The imaging planes 36, 37, and 38 are provided, respectively, with imaging elements 31, 32, and 33 for converting images provided on the respective imaging planes 36, 37, and 38 into electrical signals. The imaging elements 31, 32, and 33 are each constituted by a CCD (Charge-Coupled Device) and/or a CMOS (Complementary Meta-Oxide Semiconductor) element, etc., including a great number of pixels, capable of converting and outputting images into electrical signals for each pixel. The high- and low-magnification lenses 34 and 35 each can also be a single lens or a group of lenses in which multiple lenses are combined to correct aberration.

The distance from the high-magnification lens 34 to the imaging plane 37 in the second high-magnification optical path 52 is greater than the distance from the high-magnification lens 34 to the imaging plane 36 in the first high-magnification optical path 51. Therefore, the second high-magnification optical path 52 has a focus position where the distance from the high-magnification lens 34 to the subject semiconductor chips 63 is smaller than the distance from the high-magnification lens 34 to the subject semiconductor chips 63 in the first high-magnification optical path 51.

The relationship between the distance between a lens and an imaging plane and the distance between the lens and an imaging subject will be described with reference to FIG. 4.

Figure 4:
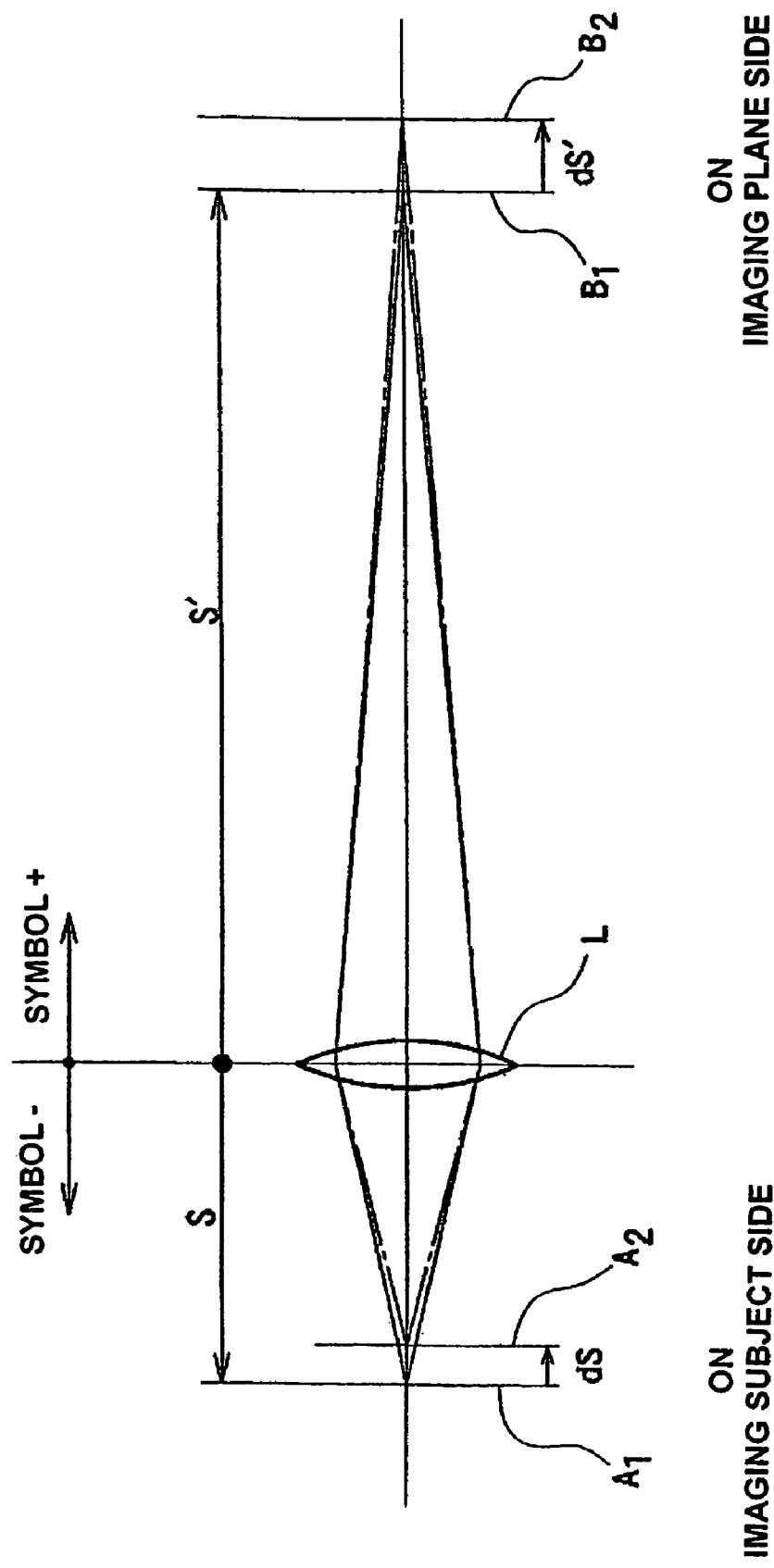
FIG. 4 is an illustrative view showing a displacement of the focus position of a lens.

As shown in FIG. 4, for the lens L, there is a relationship $1/f+1/S=1/S'$ wherein the distance from the lens L to a subject focus position $A_1$ is S, the distance from the lens L to an imaging plane $B_1$ is S', and f is the focal distance of the lens L. Therefore, if the distance from the lens L to an imaging plane $B_2$ on the imaging plane side of the lens L is greater by dS' than the distance S' from the lens L to the imaging plane $B_1$, the distance from the lens L to a focus position $A_2$ on the subject side of the lens L becomes smaller by dS than the distance S from the lens L to the focus position $A_1$. Here, the "focus position" means a position where an imaging subject therein is imaged on an imaging plane with being focused. In other words, the lens L has a property that the greater the distance between the lens and the imaging plane on the imaging plane side of the lens L, the smaller the distance between the lens and the focus position on the subject side of the lens L. This allows the focus position of the lens L to be adjusted by adjusting the distance between the lens L and the imaging plane on the imaging plane side of the lens L.

Figure 5:
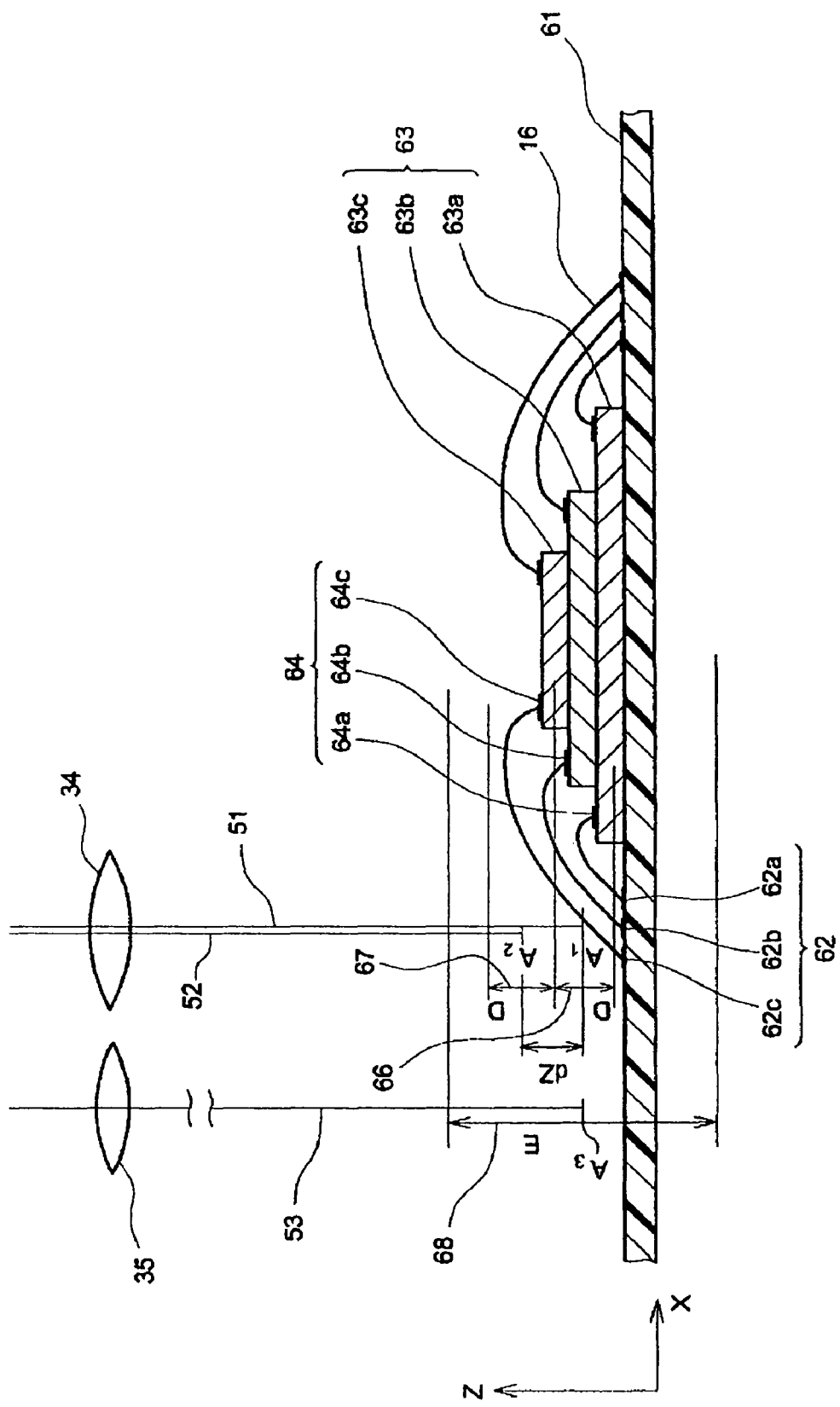
FIG. 5 is an illustrative view showing subject imaging ranges in the imaging device for bonding apparatus according to an exemplary embodiment of the invention.

Based on the above-described operating principle of the lens L, as seen from FIG. 5, the second high-magnification optical path 52, in which the distance from the high-magnification lens 34 (corresponding to the lens L) to the imaging plane 37 (see FIG. 2) is greater than the distance from the high-magnification lens 34 to the imaging plane 36, has a focus position $A_2$ where the distance from the high-magnification lens 34 to the subject semiconductor chips 63 is smaller than in the first high-magnification optical path 51. In contrast, the first high-magnification optical path 51, in which the distance from the high-magnification lens 34 to the imaging plane 36 (see FIG. 2) is smaller than the distance from the high-magnification lens 34 to the imaging plane 37, has a focus position $A_1$ where the distance from the high-magnification lens 34 to the subject semiconductor chips 63 is greater than in the second high-magnification optical path 52.

It should be noted that in FIG. 5, optical systems other than the lenses 34 and 35 and the optical paths 51, 52, and 53 are omitted.

In the multilayer semiconductor device shown in FIG. 5, three layers of semiconductor chips 63a, 63b, and 63c are stacked and mounted on the lead frame 61. Pads 64a, 64b, and 64c on the respective multi-layered semiconductor chips 63a, 63b, and 63c and corresponding leads 62a, 62b, and 62c on the lead frame 61 are connected with each other by wires 16. Since the semiconductor chips 63a, 63b, and 63c have their respective thicknesses, the pads 64a, 64b, and 64c thereon have their respective different levels in the Z direction, i.e., the height direction. In contrast, the leads 62a, 62b, and 62c, which are formed on the surface of the lead frame 61, have little differences in level in the Z direction, i.e., the height direction.

The first high-magnification optical path 51 has a focus position $A_1$ where the distance from the high-magnification lens 34 is greater than in the second high-magnification optical path 52, while the second high-magnification optical path 52 has a focus position $A_2$ where the distance from the high-magnification lens 34 is smaller than in the first high-magnification optical path 51. The distance between the focus positions $A_1$ and $A_2$ is dZ. In contrast, the high-magnification lens 34 has a depth-of-field D within which imaging subjects can be imaged with being focused. Thus, in the first high-magnification optical path 51, imaging subjects can be imaged on the imaging plane 36 with being focused within the depth-of-field D centering on the focus position $A_1$ in the direction along the first high-magnification optical path 51, that is, in the Z direction, i.e., the height direction. The depth-of-field D centering on the focus position $A_1$ provides a subject imaging range 66 in the first high-magnification optical path 51, and the imaging element 31 for the first high-magnification optical path 51 can image imaging subjects within the subject imaging range 66. In the second high-magnification optical path 52, imaging subjects can also be imaged on the imaging plane 37 with being focused within the depth-of-field D centering on the focus position $A_2$ in the direction along the second high-magnification optical path 52, that is, in the Z direction, i.e., the height direction. The depth-of-field D centering on the focus position $A_2$ provides a subject imaging range 67 in the second high-magnification optical path 52, and the imaging element 32 for the second high-magnification optical path 52 can image subjects within the subject imaging range 67.

Since both the first and second high-magnification optical paths 51 and 52 pass through the same high-magnification lens 34, the depth-of-fields D of the respective optical paths 51 and 52 have an equal range. The distance dZ between the focus positions $A_1$ and $A_2$ depends on the difference between the distance from the high-magnification lens 34 to the imaging plane 36 and the distance from the high-magnification lens 34 to the imaging plane 37. According to the exemplary embodiment of the present invention, dZ is set to be equal to the depth-of-field D, as shown in FIG. 5. The first and second high-magnification optical paths 51 and 52 can also have the same field of view or their respective different fields of view.

In contrast, as shown in FIG. 5, the low-magnification optical path 53 uses the low-magnification lens 35 with a magnification lower than that of the high-magnification lens 34 for imaging. Since lower-magnification lenses have larger depth-of-fields, the low-magnification lens 35 has a depth-of-field E larger than that of the high-magnification lens 34, and imaging subjects can be imaged on the imaging plane 38 with being focused within the depth-of-field E centering on the focus position $A_3$ in the direction along the low-magnification optical path 53, that is, in the Z direction, i.e., the height direction. The depth-of-field E centering on the focus position $A_3$ provides a subject imaging range 68 in the low-magnification optical path 53. Since the depth-of-field E of the low-magnification lens 35 is large, the subject imaging range 68 in the low-magnification optical path 53 includes the lead frame 61 and the multi-layered semiconductor chips 63a, 63b, and 63c mounted on the lead frame.

Figure 6:
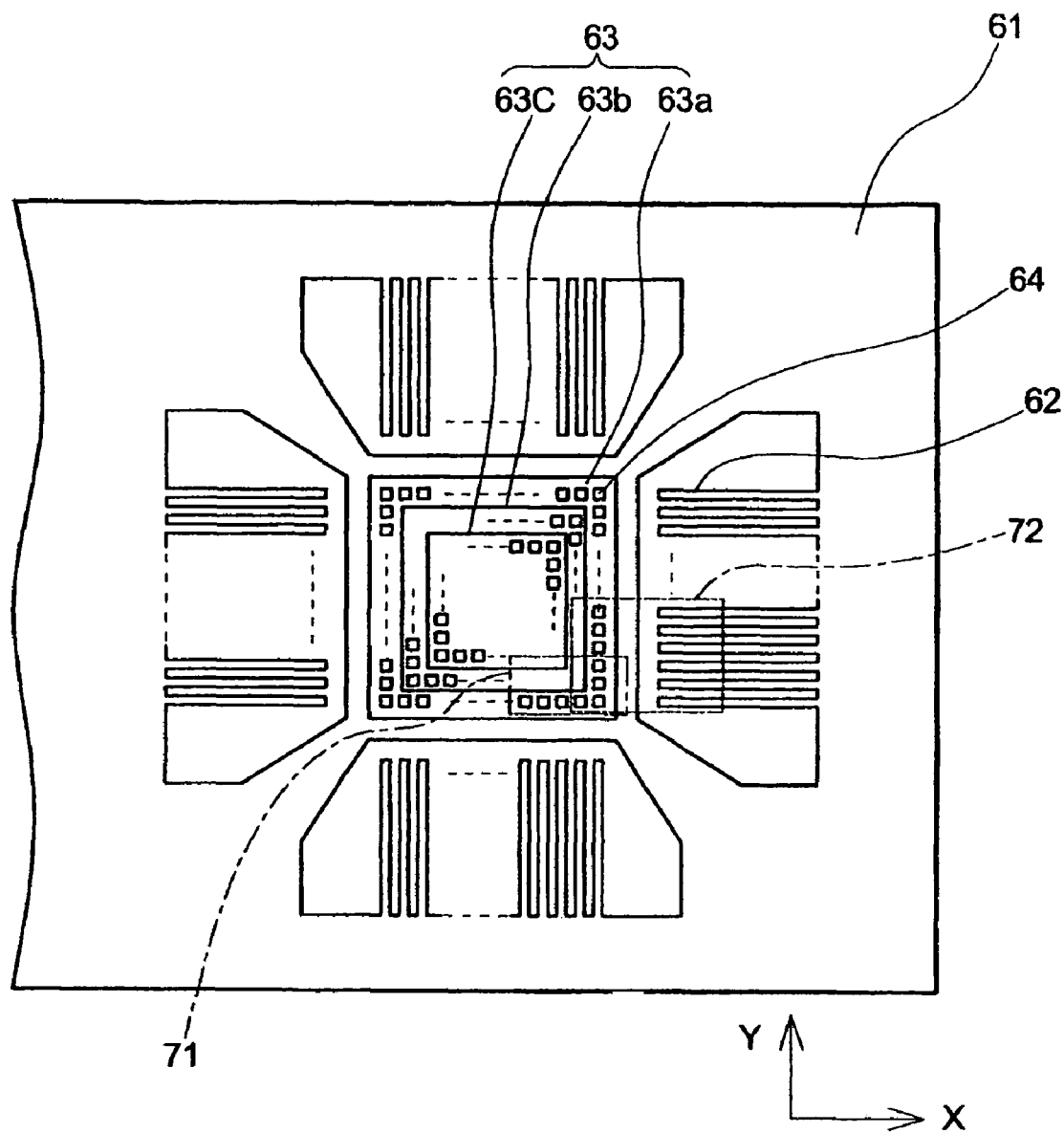
FIG. 6 is an illustrative view showing fields of view in the imaging device for bonding apparatus according to an exemplary embodiment of the invention.

FIG. 6 shows an example of a field of view 71 of the high-magnification optical system including the first and second high-magnification optical paths 51 and 52 and a field of view 72 of the low-magnification optical system including the low-magnification optical path 53 on the lead frame 61 and the semiconductor chips 63. As shown in FIG. 6, since the high-magnification optical system uses the high-magnification lens 34 for imaging, the field of view 71 includes one corner of the semiconductor chips 63. However, since the low-magnification optical system uses the low-magnification lens 35 for imaging that has a magnification lower than that of the high-magnification lens 34, the field of view 72 is wider than the field of view 71 of the high-magnification optical system. Although FIG. 6 shows a case where the field of view 72 of the low-magnification optical system includes part of the semiconductor chips 63 and several leads 62, leads 62 can only be included depending on the position of the field of view.

Figure 7:
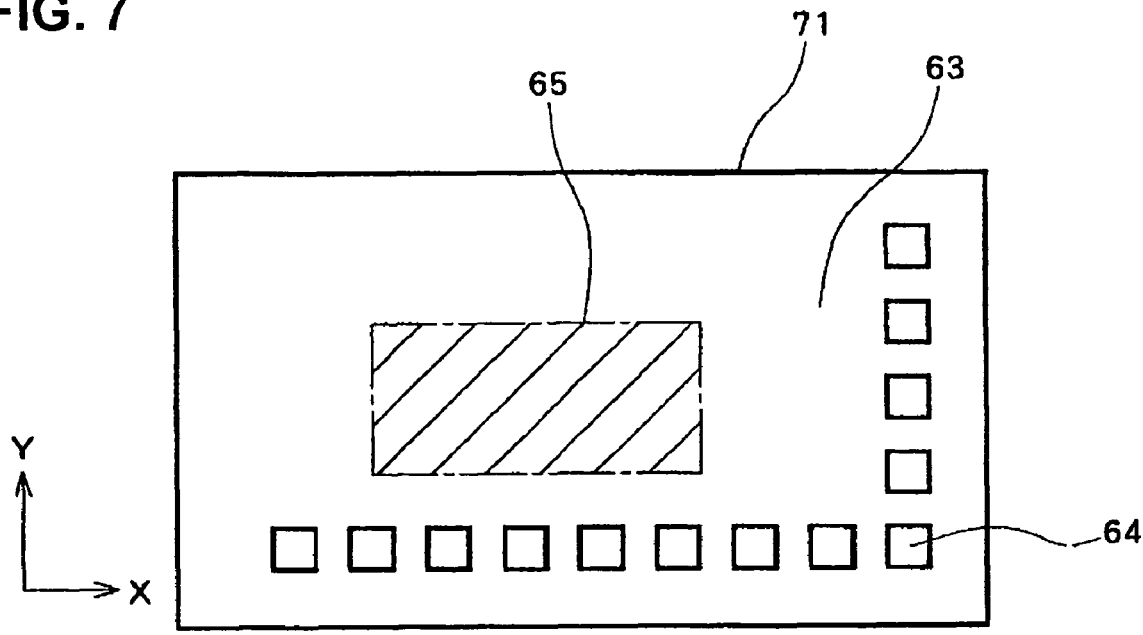
FIG. 7 is an illustrative view showing the field of view of a high-magnification optical system in the imaging device for bonding apparatus according to an exemplary embodiment of the invention.
Figure 8:
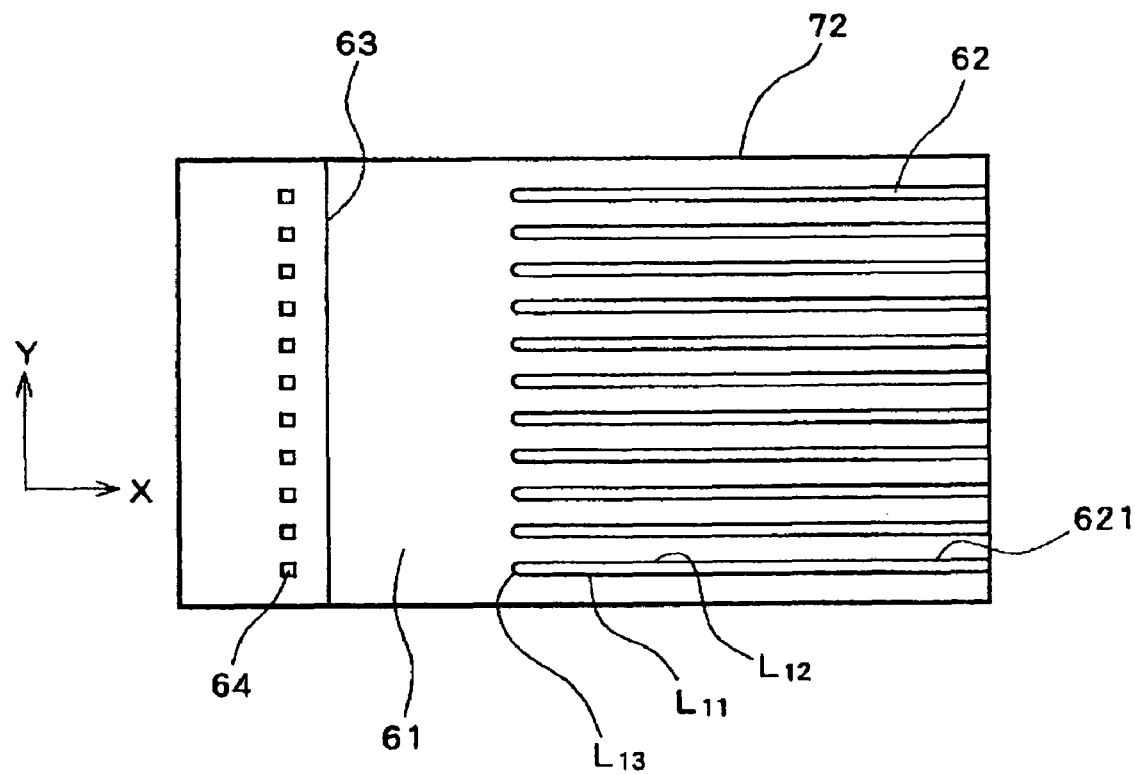
FIG. 8 is an illustrative view showing the field of view of a low-magnification optical system in the imaging device for bonding apparatus according to an exemplary embodiment of the invention.

FIG. 7 shows the field of view 71 of the high-magnification optical system in the same size as the field of view 72 of the low-magnification optical system, where the field of view 71 of the high-magnification optical system includes pads 64 on the semiconductor chips 63 and a particular pattern 65 imaged largely therein. As shown in FIG. 8, since the field of view 72 of the low-magnification optical system images a larger area than the high-magnification optical system within the same sized field of view, pads on the semiconductor chips 63 and leads 62 arranged on the lead frame 61 are imaged smaller than in the high-magnification optical system.

The alignment between pads 64 on the semiconductor chips 63 and leads 62 on the lead frame 61 using the above-described images taken by the imaging device 21 for bonding apparatus will be described below.

When the lead frame 61 with semiconductor chips 63 bonded thereon is carried to a predetermined position along the guide rails 81a and 81b shown in FIG. 1, the imaging device 21 sets the position of the field of view 72 of the low-magnification optical system to include several leads 62 on the lead frame 61 as shown in FIG. 8, and the imaging element 33 (see FIG. 3) outputs an image including the several leads 62 as electrical signals for each pixel. The electrical signals for each pixel of the imaging element 33 is input to a control device not shown in the drawings, and the control device detects the edges $L_{11}$ and $L_{12}$ of a lead 621 that extend in the X direction by, for example, normalized correlation processing. Then, the distances in the Y direction between the center of the field of view 72 and the respective edges $L_{11}$ and $L_{12}$ detected are obtained based on the difference in the number of pixels between the pixel positions in the Y direction of the respective edges $L_{11}$ and $L_{12}$ and the pixel position of the center of the field of view 72. Similarly, the control device detects the leading end portion $L_{13}$ of the lead 621 that extends in the X direction by, for example, normalized correlation processing, and then the distance between the center of the field of view 72 and the leading end portion $L_{13}$ detected are obtained based on the difference in the number of pixels between the pixel position in the X direction of the leading end portion $L_{13}$ and the pixel position of the center of the field of view 72. The control device thus obtains the coordinate positions in the X and Y directions of the leading end of the lead 621 with respect to the center of the field of view 72. Since the imaging device 21 is fixed to the bonding head 11 and thereby the coordinate position of the center of the field of view 72 in the imaging device 21 with respect to the wire bonder 10 is known, thus obtaining the X and Y coordinate positions of the leading end of the lead 621 with respect to the center of the field of view 72 allows the coordinate position of the leading end of the lead 621 with respect to the entire wire bonder 10 to be obtained. Subsequently, the control device obtains the coordinate positions in the X and Y directions of the leading end of each of the several leads 62 with respect to the center of the field of view 72 to obtain the coordinate position of the leading end of each lead 62 with respect to the entire wire bonder 10.

After obtaining the coordinate positions in the X and Y directions of the leading end of each lead 62 included in the field of view 72 with respect to the entire wire bonder 10, the imaging device 21 then moves to a position where the area adjacent to the field of view 72 in the Y direction shown in FIG. 6 is included in the field of view, and the coordinate position of the leading end of each lead 62 imaged in the next field of view is obtained. The imaging device 21 repeats these operations sequentially to scan all the leads 62 around the semiconductor chips 63 and thereby obtain the coordinate positions of the leading ends of all the leads 62. According to the exemplary embodiment of the present invention, since the field of view 72 shown in FIG. 6 can include about one-third of the leads 62 arranged to face one side of the semiconductor chips 63, only twelve different positions for each field of view are required for imaging to obtain the coordinate positions of all the leads 62 on the lead frame 61, which requires only a significantly smaller number of captive images than in the case of scanning each lead 62 using the field of view 71 of the high-magnification optical system shown in FIG. 6 to image all the leads 62. The shown exemplary embodiment thereof thus has such an advantageous effect that the time for imaging the lead frame 61 and therefore the time for obtaining the coordinate positions of the leads 62 can be reduced to achieve high-speed wire bonding.

Next, the imaging device 21 sets the position of the field of view 71 of the high-magnification optical system to include the particular pattern 65 in the corner of the semiconductor chips 63 as shown in FIG. 7, and the imaging element 31 or 32 outputs an image including the particular pattern 65 as electrical signals for each pixel. The electrical signals for each pixel of the imaging element 31 or 32 is input to the control device not shown in the drawings, and the control device performs, for example, normalized correlation processing to obtain the distances in the X and Y directions between the center of the field of view 71 and the particular pattern 65 based on the difference in the number of pixels between the pixel position of the particular pattern 65 and the pixel position of the center of the field of view 72. Then, the X and Y coordinate positions of the particular pattern 65 are obtained with respect to the center of the field of view 71 and therefore the wire bonder 10.

Next, the imaging device 21 moves to a position where the opposing corner of the semiconductor chips 63 is included in the field of view to obtain the coordinate position of another particular pattern 65 in the opposing corner. Since pads 64 on the semiconductor chips 63 are manufactured to have more accurate positions than leads 62 on the lead frame 61, obtaining the coordinate positions of the two opposing particular patterns 65 to locate the coordinate positions of the semiconductor chips 63 leads to locating the coordinate positions of the pads 64. This allows the coordinate positions of the pads 64 on the semiconductor chips 63 to be obtained without detecting the position of each pad 64.

When obtaining the coordinate positions of the pads 64 on the semiconductor chips 63, the imaging element 31 for the first high-magnification optical path 51 is used if the position in the Z direction, i.e., the height direction of each pad 64 on the subject semiconductor chips 63, is within the subject imaging range 66 in the first high-magnification optical path 51 shown in FIG. 5, while the imaging element 32 for the second high-magnification optical path 52 is used if the position in the Z direction of each pad 64 on the subject semiconductor chips 63 is within the subject imaging range 67 in the second high-magnification optical path 52 shown in FIG. 5. If the semiconductor chips 63 are stacked in multiple layers as shown in, for example, FIG. 5, the imaging element 31 for the first high-magnification optical path 51 is used to image the semiconductor chips 63a and 63b and obtain the coordinate positions of the pads 64a and 64b in the first and second layers belonging to the subject imaging range 66 far from the high-magnification lens 34, while the imaging element 32 for the second high-magnification optical path 52 is used to image the semiconductor chip 63c and obtain the coordinate position of the pad 64c in the third layer belonging to the subject imaging range 67 centering on the focus position $A_2$ close to the high-magnification lens 34. Since the exemplary embodiment of the present invention thus includes two high-magnification optical paths 51 and 52 as well as two imaging elements 31 and 32 therefor, images within a large subject imaging range in the Z direction, i.e., the height direction, can be taken with no lens shift while using the high-magnification lens 34 during wire bonding in such multi-layered semiconductor chips as shown in FIG. 5 with a great difference in level in the Z direction, i.e., the height direction, so that the semiconductor chips 63a, 63b, and 63c with a great difference in level in the height direction can be imaged accurately.

After obtaining the coordinate position of the leading end of each lead 62 and the coordinate position of each pad 64 through the foregoing operations, the wire bonder 10 operates the bonding head 11 and the Z-direction drive mechanism 18 shown in FIG. 1 to drive the capillary 14 in the X, Y, and Z directions that is fixed to the leading end of the ultrasonic horn 13 and thereby to bond the wire 16, which is inserted through the capillary 14, between each pad 64 on the semiconductor chips 63 and each lead 62 on the lead frame 61 shown in FIG. 5.

Then, when all the pads 64 on one set of semiconductor chips 63 have completely been connected to leads 62 on the lead frame 61 through wires 16, the lead frame 61 is carried so that the next set of semiconductor chips 63 are brought to the bonding position. The imaging device 21 scans images of the lead frame 61 again to obtain the coordinate position of each lead 62 and the coordinate position of each particular pattern 65 on the semiconductor chips 63 for the next wire bonding.

As seen from the above, the imaging device 21 according to the above-described exemplary embodiment of the present invention, which scans each lead 62 through the low-magnification optical system with a wide field of view to image all the leads 62, requires a small number of captive images; accordingly, the time for imaging the lead frame and therefore the time for obtaining the coordinate positions of the leads 62 can be reduced to achieve high-speed wire bonding. In addition, since the two high-magnification optical paths 51 and 52 as well as two imaging elements 31 and 32 therefor are provided in the high-magnification optical system, images within a large subject imaging range in the height direction can be taken with no lens shift while using the high-magnification lens 34 during wire bonding in multi-layered semiconductor chips with a great difference in level in the height direction, so that the semiconductor chips 63a, 63b, and 63c with a great difference in level in the height direction can be imaged accurately.

Although in the above-described exemplary embodiment of the present invention, the high-magnification optical system includes two high-magnification optical paths, more than two high-magnification optical paths can be provided in accordance with the difference in level of the semiconductor chips 63. In the exemplary embodiment of the present invention, which describes the case of imaging the lead frame 61 and the semiconductor chips 63 mounted on the lead frame 61, can also be applied to the case of imaging a substrate such as a BGA (Ball Grid Array) package and semiconductor chips 63 mounted on a substrate.

Next will be described another exemplary embodiment of the present invention with reference to FIG. 9. Components identical with those in the exemplary embodiment thereof described with reference to FIG. 3 are designated by the same reference numerals to omit descriptions thereof in FIG. 9. The imaging device 21 for bonding apparatus according to the exemplary embodiment thereof includes as seen from FIG. 2: an introduction section 22 for introducing light from the subject semiconductor chips 63 or lead frame 61 therethrough; a tubular framework 23 incorporating optical components such as lenses and mirrors to guide light incident through the introduction section 22; and cameras 24, 25, and 26 including imaging elements attached to the tubular framework 23 to receive light through the tubular framework 23 as shown in FIG. 2, as is the case in the above-described exemplary embodiment of the present invention.

Figure 9:
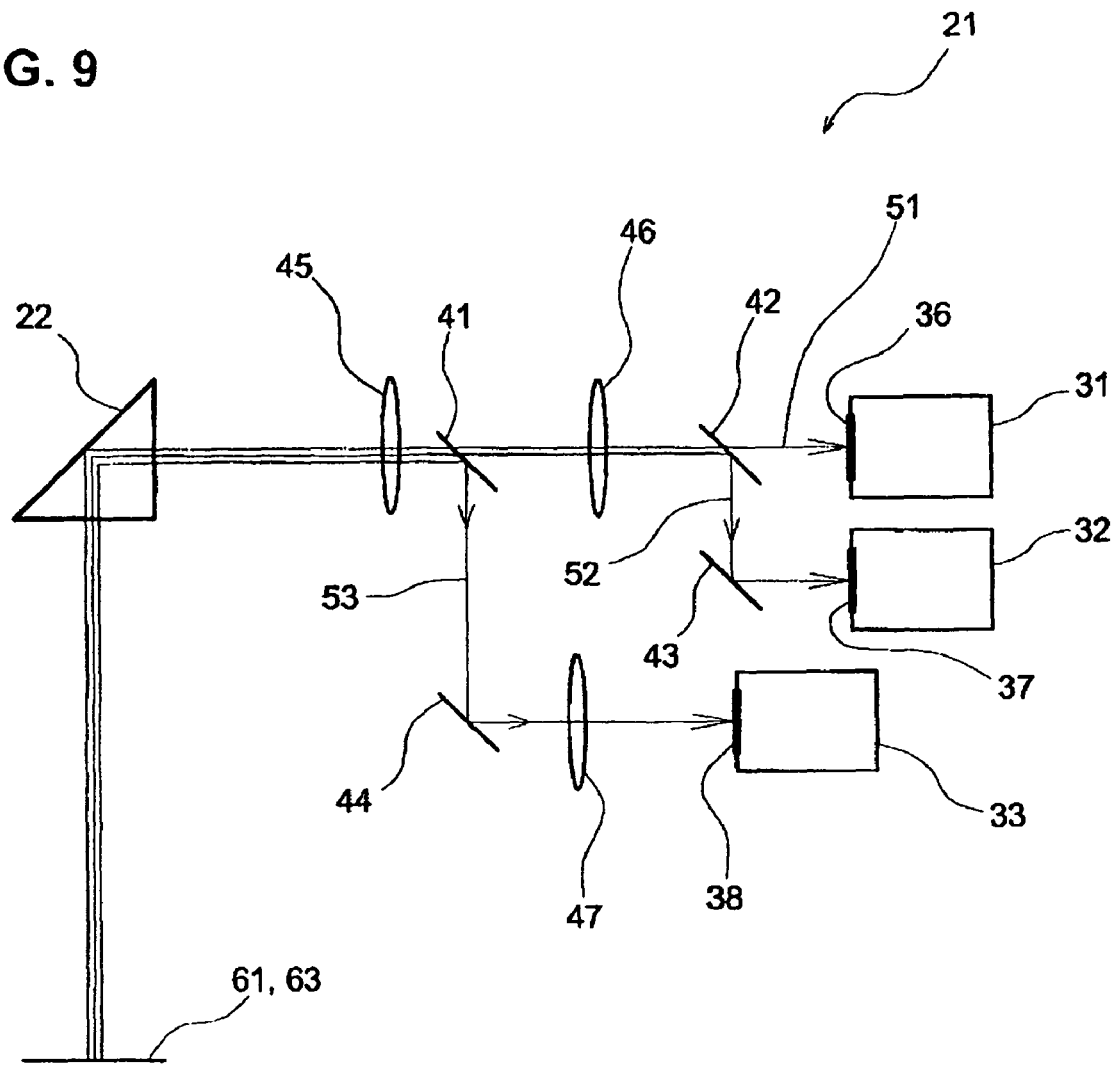
FIG. 9 is an illustrative view showing the configuration of optical systems in an imaging device for bonding apparatus according to another exemplary embodiment of the invention.

As shown in FIG. 9, the imaging device 21 for bonding apparatus according to the exemplary embodiment of the present has a high-magnification optical system as a first optical system and a low-magnification optical system as a second optical system. The high-magnification optical system includes a first high-magnification optical path 51 extending from the subject semiconductor chips 63 or lead frame 61 to an imaging plane 36 through the introduction section 22, a subject side lens 45 and a half mirror 41, a first imaging plane lens 46, and a half mirror 42; and a second high-magnification optical path 52 extending from the subject semiconductor chips 63 or lead frame 61 to an imaging plane 37 through the introduction section 22, subject side lens 45 and half mirror 41, first imaging plane lens 46, reflected at the half mirror 42 to branch from the first high-magnification optical path 51, and reflected at a mirror 43. The low-magnification optical system includes: a low-magnification optical path 53 extending from the subject semiconductor chips 63 or lead frame 61 to an imaging plane 38 through the introduction section 22, subject side lens 45, reflected at the half mirror 41 between the subject side lens 45 and the first imaging plane lens 46 to branch from the high-magnification optical system, and reflected at a mirror 44 to pass through a second imaging plane lens 47.

The subject side lens 45 and the first imaging plane lens 46 form a high-magnification total lens, while the subject side lens 45 and the second imaging plane lens 47 form a low-magnification total lens having a lower total magnification than the high-magnification total lens formed by the subject side lens 45 and the first imaging plane lens 46. The subject side lens 45 and the first and second imaging plane lenses 46 each can also be a single lens or a group of lenses in which multiple lenses are combined to correct aberration. Further, the imaging planes 36, 37, and 38 are provided, respectively, with imaging elements 31, 32, and 33 for converting images provided on the respective imaging planes 36, 37, and 38 into electrical signals. The imaging elements 31, 32, and 33 are each constituted by a CCD and/or a CMOS element, etc., including a great number of pixels, capable of converting and outputting images into electrical signals for each pixel.

The high-magnification optical system substantially has one high-magnification-total lens formed by the subject side lens 45 and the first imaging plane lens 46. Accordingly, as seen from FIG. 4, the distance S' between the lens L and the imaging plane on the imaging plane side of the lens corresponds to the distance between the first imaging plane lens 46 and the imaging plane 36 or 37. Accordingly, the second high-magnification optical path 52, in which the distance from the first imaging plane lens 46 to the imaging plane 37 is greater than the distance from the first imaging plane lens 46 to the imaging plane 36 and thereby the distance from the high-magnification total lens to the imaging plane 37 is greater than the distance from the high-magnification total lens to the imaging plane 36, has a focus position $A_2$ where the distance from the subject side of the lens 45 of the high-magnification total lens to the subject semiconductor chips 63 is smaller than in the first high-magnification optical path 51. In contrast, the first high-magnification optical path 51, in which the distance from the first imaging plane lens 46 to the imaging plane 36 is smaller than the distance from the first imaging plane lens 46 to the imaging plane 37 and thereby the distance from the high-magnification total lens to the imaging plane 36 is smaller than the distance from the high-magnification total lens to the imaging plane 37, has a focus position $A_1$ where the distance from the subject side lens 45 of the high-magnification total lens to the subject semiconductor chips 63 is greater than in the second high-magnification optical path 52.

The low-magnification optical system is the same as in the above-described exemplary embodiment of the present invention except that it includes the second imaging plane lens 47 having a lower total magnification with the subject side lens 45, which is used commonly with the high-magnification optical system, than the high-magnification total lens.

The alignment method between pads 64 on the semiconductor chips 63 and leads 62 on the lead frame 61 using images taken by the imaging device 21 for bonding apparatus according to the exemplary embodiment of the present invention is the same as in the above-described exemplary embodiment thereof.

In addition to the same advantageous effects as in the above-described exemplary embodiment of the present invention, the exemplary embodiment thereof, in which each optical system includes a total lens formed by the subject side lens 45 and the first or second imaging plane lens 46 or 47, exhibits an advantageous effect that the length of the entire optical systems can be reduced to provide a space-saving imaging device 21 for bonding apparatus.

In the exemplary embodiment of present invention, which describes the case of imaging the lead frame 61 and the semiconductor chips 63 mounted on the lead frame 61, can be applied to the case of imaging a substrate such as a BGA package and semiconductor chips 63 mounted on the substrate. The substrate can also include a tape with leads printed thereon.

Figure 10:
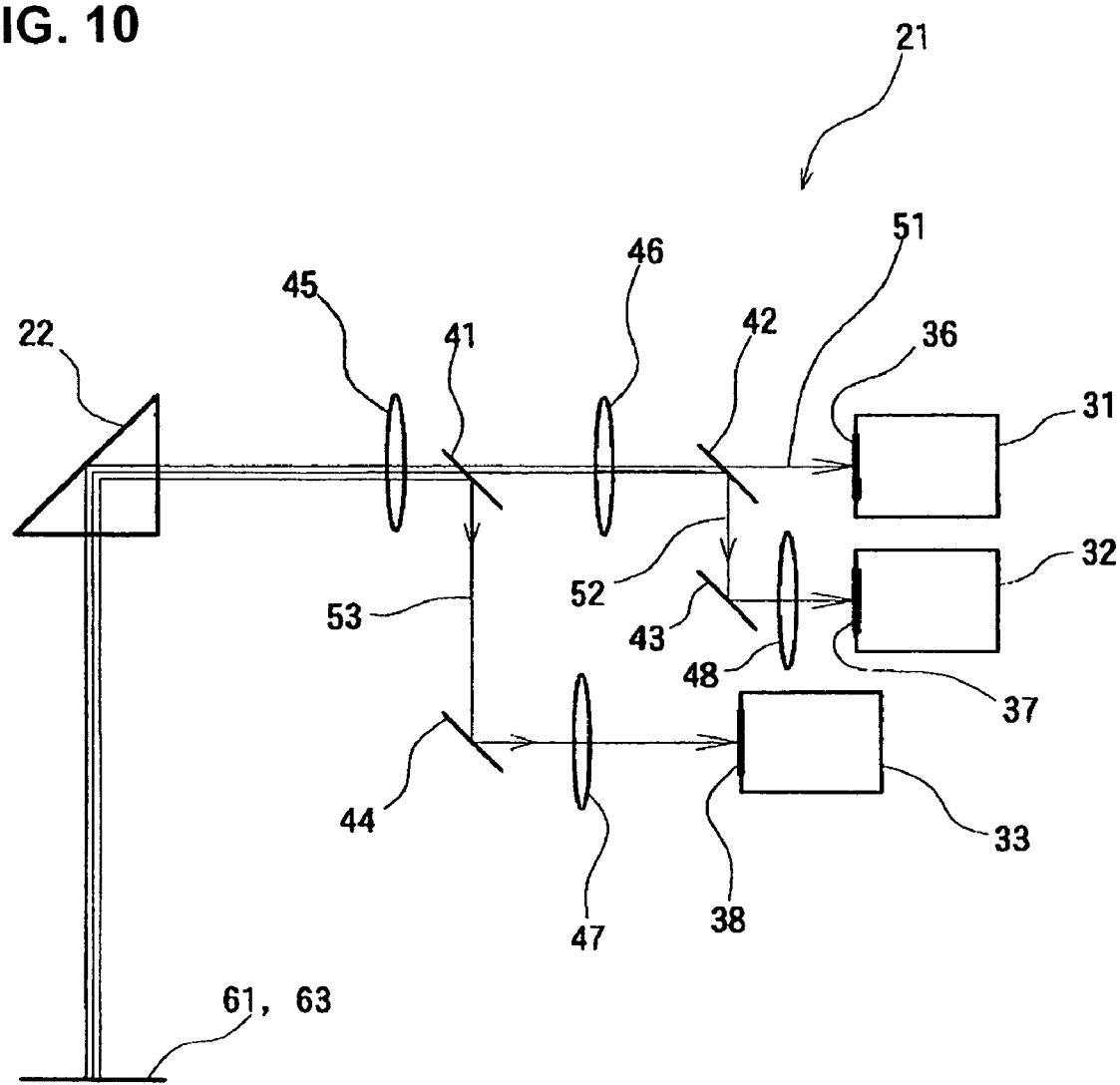
FIG. 10 is an illustrative view showing the configuration of optical systems in an imaging device for bonding apparatus according to still another exemplary embodiment of the invention.

Still another exemplary embodiment of the present invention will be described with reference to FIG. 10. Components identical with those in the exemplary embodiments thereof described with reference to FIGS. 3 and 9 are designated by the same reference numerals to omit descriptions thereof.

In the imaging device 21 for bonding apparatus according to the exemplary embodiment of the present invention, an auxiliary lens 48 for optical path adjustment is provided between the mirror 43 and the imaging plane 37 in the second high-magnification optical path 52 in the exemplary embodiment thereof described in FIG. 9. Adjusting the position in the direction along the second high-magnification optical path 52 of the auxiliary lens 48 allows the focus position $A_2$ of the second high-magnification optical path 52 and the position of the subject imaging range 67 to be adjusted in the direction along the second high-magnification optical path 52, that is, in the Z direction, i.e., the height direction shown in FIG. 5, so that the distance dZ between the subject imaging range 66 in the first high-magnification optical path 51 and the subject imaging range 67 in the second high-magnification optical path 52 can be set so that the subject imaging ranges 66 and 67 are arranged to be overlapped with each other or to have a clearance therebetween.

Although the above-described exemplary embodiments of the present invention describe the case of applying the imaging device for bonding apparatus to the wire bonder 10, the present invention can be applied to other bonding apparatuses such as die bonders, flip-chip bonders, and tape bonders.

The invention claimed is:

1. An imaging device for a bonding apparatus for imaging an imaging subject and multi-layered semiconductor chips mounted on said imaging subject, comprising:
a first optical system having a plurality of optical paths that extend to a plurality of imaging planes through a first lens and have different optical path lengths from said first lens to said respective imaging planes correspondingly to a plurality of subject imaging ranges at different distances from said first lens;
a second optical system branching from said first optical system on a subject side of said first lens and having an optical path that extends to an imaging plane through a second lens with a lower magnification than said first lens, said second optical system having a field of view wider than that of said first optical system;
first imaging elements provided on said respective imaging planes in said first optical system to image each layer of said multi-layered semiconductor chips mounted on said imaging subject; and
a second imaging element provided on said imaging plane in said second optical system to image said imaging subject.

2. The imaging device for bonding apparatus according to claim 1 wherein
said first imaging elements in said first optical system are configured to cooperate with each other to image each layer of said multi-layered semiconductor chips mounted on said imaging subject.

3. The imaging device for a bonding apparatus according to claim 1, wherein said imaging subject is one selected from the group consisting of a lead frame and a substrate.

4. An imaging device for a bonding apparatus for imaging an imaging subject and multi-layered semiconductor chip mounted on said imaging subject, comprising:
a first optical system having a plurality of optical paths that extend to a plurality of imaging planes through a subject side lens and a first imaging plane lens and have different optical path lengths from said subject side lens to said respective imaging planes;
a second optical system branching from said first optical system between said subject side lens and said first imaging plane lens and having an optical path that extends to an imaging plane through a second imaging plane lens having a total magnification with said subject side lens that is lower than a total magnification of said subject side lens with said first imaging plane lens, said second optical system having a field of view wider than that of said first optical system;
first imaging elements provided on said respective imaging planes in said first optical system to image each layer of said multi-layered semiconductor chips mounted on said imaging subject; and
a second imaging element provided on said imaging plane in said second optical system to image said imaging subject.

5. The imaging device for bonding apparatus according to claim 4, wherein
said first optical system is provided with an optical path length adjustment means installed in each optical path between said first imaging plane lens and each one of said plurality of imaging planes, said optical path length adjustment means being positioned variably in a direction along each one of said optical paths.

6. The imaging device for bonding apparatus according to claim 5, wherein said optical path length adjustment means is an optical path length adjustment lens, said optical path length adjustment lens is made of one selected from the group consisting of a light transmitting glass, a light transmitting plastic, and a light transmitting ceramic.

7. The imaging device for a bonding apparatus according to claim 4, wherein said imaging subject is one selected from the group consisting of a lead frame and a substrate.

8. The imaging device for bonding apparatus according to claim 4, wherein said first imaging elements in said first optical system are configured to cooperate with each other to image each layer of said multi-layered semiconductor chips mounted on said imaging subject.

9. An imaging method of imaging an imaging subject and multi-layered semiconductor chips mounted on said imaging subject using an imaging device for a bonding apparatus, comprising the steps of:
    providing an imaging device for a bonding apparatus, said imaging device comprising:
        a first optical system having a plurality of optical paths that extend to a plurality of imaging planes through a first lens and have different optical path lengths from said first lens to said respective imaging planes correspondingly to a plurality of subject imaging ranges at different distances from said first lens,
        a second optical system branching from said first optical system on a subject side of said first lens and having an optical path that extends to an imaging plane through a second lens with a lower magnification than said first lens, said second optical system having a field of view wider than that of said first optical system, and
        first imaging elements provided on said respective imaging planes in said first optical system and a second imaging element provided on said imaging plane in
    a lead image imaging step of scanning the field of view of said second optical system on said imaging subject to cause said second imaging element provided on said imaging plane in said second optical system to image said imaging subject including leads around an entire circumference of said multi-layered semiconductor chips; and
    a semiconductor chip imaging step of, using said first imaging elements provided on said respective imaging planes in said first optical system, imaging each layer of said multi-layered semiconductor chips at a plurality of height positions.

10. The imaging method according to claim 9, wherein said imaging subject is one selected from the group consisting of a lead frame and a substrate.

11. An imaging method of imaging an imaging subject and multi-layered semiconductor chips mounted on said imaging subject using an imaging device for a bonding apparatus, comprising the steps of:
    providing an imaging device for a bonding apparatus, said imaging device comprising:
        a first optical system having a plurality of optical paths that extend to a plurality of imaging planes through a subject side lens and a first imaging plane lens and have different optical path lengths from said first subject side lens to said respective imaging planes correspondingly to a plurality of subject imaging ranges at different distances from said subject side lens,
        a second optical system branching from said first optical system between said subject side lens and said first imaging plane lens and having an optical path that extends to an imaging plane through a second imaging plane lens having a total magnification with said subject side lens that is lower than a total magnification of said subject side lens with said first imaging plane lens, said second optical system having a field of view wider than that of said first optical system,
        first imaging elements provided on said respective imaging planes in said first optical system, and
        a second imaging element provided on said imaging plane in said second optical system;
    a lead image imaging step of scanning the field of view of said second optical system on said imaging subject to cause said second imaging element provided on said imaging plane in said second optical system to image said imaging subject including leads around an entire circumference of said multi-layered semiconductor chips; and
    a semiconductor chip imaging step of, using said first imaging elements provided on said respective imaging planes in said first optical system, imaging each layer of said multi-layered semiconductor chips at a plurality of height positions.

12. The imaging method according to claim 11, wherein said imaging subject is one selected from the group consisting of a lead frame and a substrate.

* * * * *